US011038402B2

(12) United States Patent
Gurr et al.

(10) Patent No.: US 11,038,402 B2
(45) Date of Patent: Jun. 15, 2021

(54) ELECTRONIC CONTROL UNIT FOR OPERATING AN ELECTRIC MOTOR HAVING A BRAKING RESISTOR

(71) Applicant: Andreas Stihl AG & Co. KG, Waiblingen (DE)

(72) Inventors: Kay-Steffen Gurr, Heilbronn (DE); Gernot Liebhard, Waiblingen (DE); Lothar Lehmann, Altbach (DE); Rudolf Saemann, Balingen (DE)

(73) Assignee: Andreas Stihl AG & Co. KG, Waiblingen (DE)

( * ) Notice: Subject to any disclaimer, the term of this patent is extended or adjusted under 35 U.S.C. 154(b) by 746 days.

(21) Appl. No.: 15/459,919

(22) Filed: Mar. 15, 2017

(65) Prior Publication Data

US 2017/0271952 A1 Sep. 21, 2017

(30) Foreign Application Priority Data

Mar. 16, 2016 (DE) ...................... 10 2016 003 255.3

(51) Int. Cl.
*H02K 9/02* (2006.01)
*H02P 3/12* (2006.01)
*H05K 1/16* (2006.01)
*H02K 11/30* (2016.01)

(52) U.S. Cl.
CPC .............. *H02K 9/02* (2013.01); *H02K 11/30* (2016.01); *H02P 3/12* (2013.01); *H05K 1/167* (2013.01); *H05K 2201/09263* (2013.01); *H05K 2201/09972* (2013.01)

(58) Field of Classification Search
CPC ...... C08L 67/04; C08L 2666/02; C08L 69/00; C08L 2666/18; C08L 67/02
See application file for complete search history.

(56) References Cited

U.S. PATENT DOCUMENTS

| 6,938,733 | B2 | 9/2005 | Eilinger |
| 7,679,300 | B2 | 3/2010 | Miyaura et al. |
| 2008/0135268 | A1* | 6/2008 | Tadokoro ............... B25F 5/008 173/2 |

(Continued)

FOREIGN PATENT DOCUMENTS

| DE | 10352653 A1 | 7/2004 |
| EP | 1791246 A2 | 5/2007 |

(Continued)

OTHER PUBLICATIONS

Translation of WO9211679A1 has been attached.*
Translation of WO0174703A1 has been attached.*

*Primary Examiner* — Zoheb S Imtiaz
(74) *Attorney, Agent, or Firm* — Walter Ottesen, P.A.

(57) ABSTRACT

An electronic control unit is configured to operate an electric motor from a rechargeable battery pack. The control unit has a circuit board with electronic components for driving the electric motor. Furthermore, an electrical braking circuit having a braking resistor and also a braking switch is provided. The receiving surface of the circuit board is spatially divided into a first surface region and a second surface region. The first surface region serves to receive electronic components; the second surface region serves to receive the braking resistor, wherein the braking resistor is configured as a conductor track which is formed on the circuit board.

19 Claims, 2 Drawing Sheets

(56) References Cited

U.S. PATENT DOCUMENTS

| | | | | |
|---|---|---|---|---|
| 2011/0241820 | A1* | 10/2011 | Tesson | H01L 23/60 338/306 |
| 2013/0042669 | A1* | 2/2013 | Humbert | G01N 27/128 73/31.06 |
| 2015/0174750 | A1 | 6/2015 | Hosking | |
| 2015/0256111 | A1* | 9/2015 | Forster | H02P 6/15 318/400.22 |
| 2016/0039633 | A1* | 2/2016 | Tutat | H05K 1/0265 187/289 |
| 2017/0055354 | A1* | 2/2017 | Meunier | H05K 7/1409 |
| 2017/0320091 | A1* | 11/2017 | Budzelaar | A61B 8/4483 |

FOREIGN PATENT DOCUMENTS

| | | | |
|---|---|---|---|
| EP | 2524773 | A2 | 11/2012 |
| EP | 2929986 | A2 | 10/2015 |
| WO | 9211679 | A1 | 7/1992 |
| WO | WO9211679 | A1 * | 7/1992 |
| WO | WO0174703 | A1 * | 10/2001 |

\* cited by examiner

ELECTRONIC CONTROL UNIT FOR OPERATING AN ELECTRIC MOTOR HAVING A BRAKING RESISTOR

CROSS REFERENCE TO RELATED APPLICATION

This application claims priority of German patent application no. 10 2016 003 255.3, filed Mar. 16, 2016, the entire content of which is incorporated herein by reference.

BACKGROUND OF THE INVENTION

Electronic control units for operating electric motors, such as DC motors, EC motors (electronically commutated motors) or similar electric motors are known.

It is also known to reduce the run-down times of an electric motor using a braking circuit by the generator voltage of the electric motor being short-circuited via a load resistor during run down, as a result of which an electromagnetic braking moment is generated. High load currents flow through the load which is in the form of a non-reactive braking resistor, the load currents being converted into heat in the braking resistor. Therefore, braking resistors are arranged separately from the electronic control unit and the electronic components of the electronic control unit and are provided with suitable large heat sinks in order to dissipate the quantity of heat produced in the event of braking.

SUMMARY OF THE INVENTION

It is an object of the invention to reduce the complexity of assembly of an electronic control unit having a braking resistor in an electrical braking circuit.

The electronic control unit of the invention is for operating an electric motor with a battery pack. The electronic control unit includes: a circuit board having a receiving surface configured to receive electronic components for controlling the electric motor; an electric braking circuit having a braking resistor; a braking switch configured to switch on the braking circuit; the receiving surface being spatially divided into a first surface region configured to receive electronic components and a second surface region configured to receive the braking resistor; and, the braking resistor being configured as a conductor track formed on the circuit board.

The receiving surface of the circuit board of the electronic control unit is spatially subdivided. The electronic components of the control unit which are required for controlling the electric motor during operation are arranged in a first surface region. According to an aspect of the invention, the braking resistor is provided in a second surface region of the circuit board, wherein the braking resistor is particularly configured as a conductor track which is formed on the circuit board.

The circuit complexity of the entire arrangement can be reduced by arranging the braking resistor on the circuit board of the control unit. The circuit board can, for example, be a printed circuit board. Physical wire connections to a braking resistor which is arranged outside the control unit are dispensed with.

In an advantageous configuration of the surface regions, provision is made to provide the second surface region for receiving the braking resistor outside the first surface region of the electronic components. The second surface region advantageously extends along at least a first edge of the circuit board, in particular along a longitudinal edge of the circuit board. It may be expedient when the conductor track of the braking resistor extends along the circuit board over two edges. If the two edges of the circuit board directly adjoin one another, the second surface region forms the shape of an L in a plan view of the flat side of the circuit board.

The second surface region has two borders which are situated at a distance opposite one another, wherein the conductor track is passed to and fro between these borders in order to form the braking resistor. Therefore, the braking resistor can be formed as a multiply wound curved path.

In an advantageous embodiment of the invention, the curved path of the conductor track of the braking resistor is configured as a meander.

It may be expedient to form the conductor track of the braking resistor on only one flat side of the circuit board. If the circuit board is plated-through, the conductor tracks can be configured for electrical connection of the components on the opposite circuit board side. In the case of a plated-through circuit board, the connection of the braking resistor to the connection lines of the electric motor can be implemented in a simple manner.

The circuit board of the control unit is advantageously potted with a potting compound. The potting compound is in direct thermally conductive contact with the conductor track of the braking resistor. In spite of the relatively flat configuration of the braking resistor as a conductor track, good heat dissipation is achieved via the potting compound, so that an impermissible increase in temperature in the area surrounding the braking resistor is avoided.

The wiring complexity for forming the braking circuit can be further reduced by the braking switch being arranged on the circuit board. If the braking switch is arranged on the circuit board, the electrical connections to the braking resistor and likewise the electrical connections to the motor can be formed as conductor tracks on the circuit board.

The circuit board is made of a composite material, in particular of an epoxy resin and a glass fiber fabric. A composite material of this kind has low flammability, for which reason corresponding chemical substances are added.

The material of the potting compound is a synthetic resin, in particular a polyurethane.

BRIEF DESCRIPTION OF THE DRAWINGS

The invention will now be described with reference to the drawings wherein.

DESCRIPTION OF THE PREFERRED EMBODIMENTS OF THE INVENTION

Figure 1:
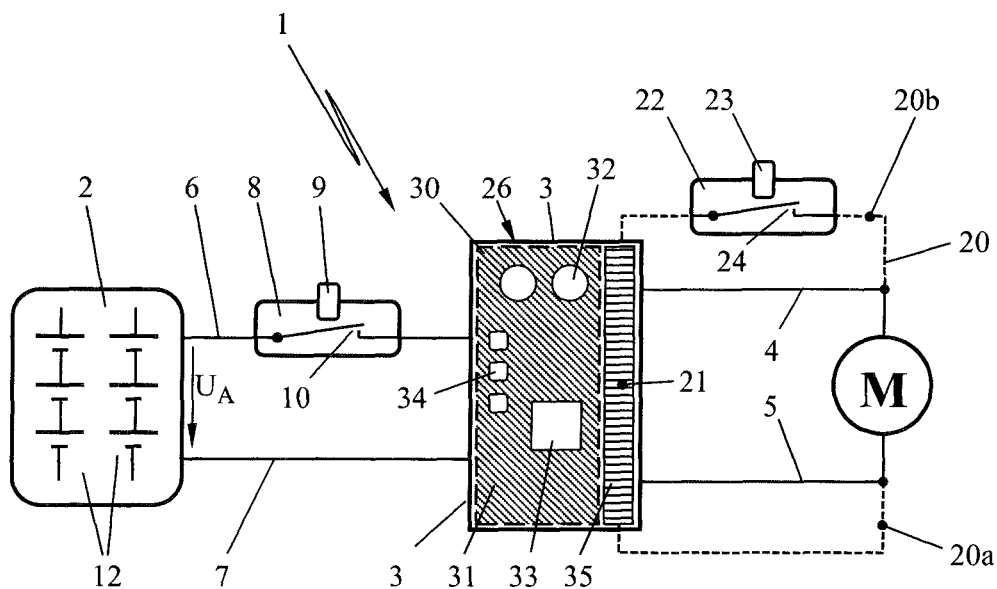
FIG. 1 shows a schematic circuit diagram of a circuit for operating an electric motor from a rechargeable battery pack.

FIG. 1 shows, in a schematic illustration, a circuit 1 including an electronic control unit 3 for operating an electric motor M.

In the embodiment shown, the electric motor M, which is preferably in the form of a DC motor, is operated from a rechargeable battery pack 2. It may be advantageous to provide, instead of the rechargeable battery pack 2, a supply system for connection to a voltage supply system.

The rechargeable battery pack 2 can include a large number of individual cells 12 which are interconnected in a suitable manner, for example in series and/or in parallel, in order to provide a rechargeable battery voltage $U_A$. As an alternative, the rechargeable battery pack 2 can also be an individual cell.

The electric motor M is operated via the electronic control unit 3. To this end, the electric motor M is connected to the control unit 3 via connection lines 4, 5. The control unit 3 is connected to the rechargeable battery pack 2 via supply lines 6, 7. An operating switch 8 is provided in order to connect and disconnect the voltage supply of the control unit 3 and of the electric motor M. The operating switch 8 is situated in the supply line 6 between the control unit 3 and the rechargeable battery pack 2 and opens or closes an electrical contact 10.

If the operating pin 9 of the operating switch 8 is pushed down, the contact 10 closes, and the operating voltage $U_A$ of the rechargeable battery pack 2 is applied to the control unit 3. In order to start up the electric motor M, the electric motor is driven by the control unit 3.

The electric motor M is further provided with an electrical braking circuit 20 which includes a braking resistor 21 and a braking switch 22. The braking circuit 20 connects the connection lines 4 and 5 to one another via the braking resistor 21. When the electrical contact 10 of the operating switch 8 is opened, the operating pin 23 of the braking switch 22 is expediently pushed down, so that the braking contact 24 is closed and the connections of the electric motor M are short-circuited via the braking resistor 21. The generator voltage of the running-down electric motor M is reduced via the braking resistor 21 as an electrical load; the running-down electric motor M is braked on account of the load current flowing in the braking circuit 20.

Figure 2:
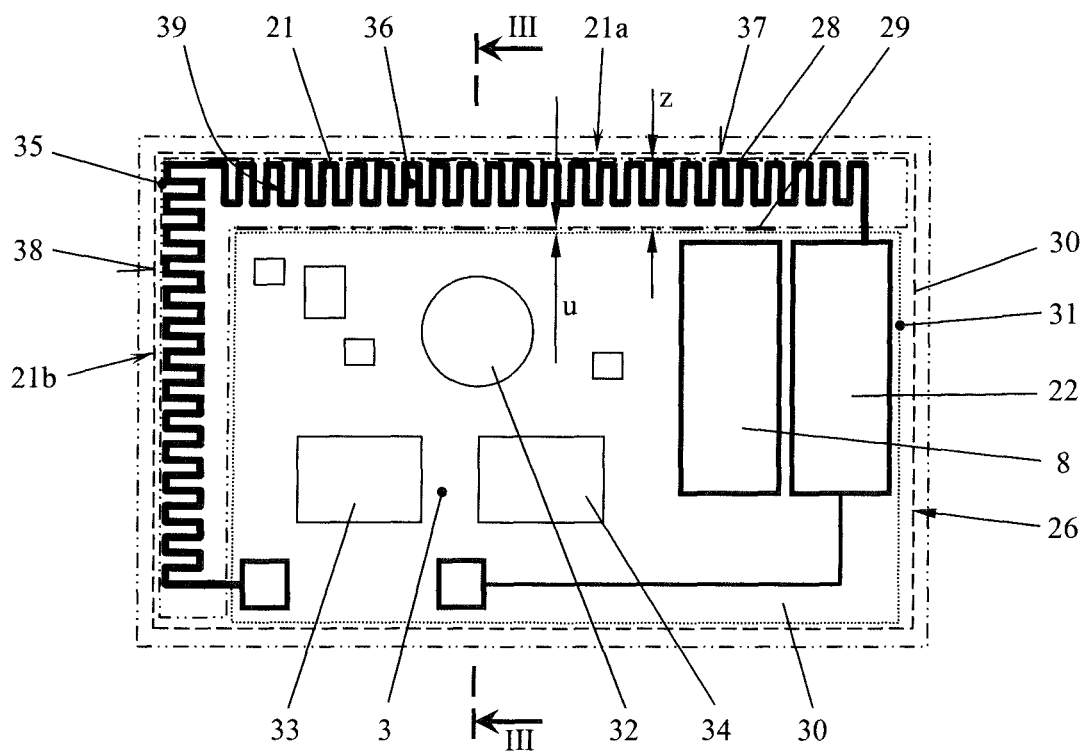
FIG. 2 shows a plan view of a flat side of the circuit board of a control unit; and, FIG. 3 shows a section through the circuit board of the electronic control unit along line in FIG. 2.

The electronic control unit 3 for operating the electric motor M is expediently arranged on a circuit board 30 which, according to an aspect of the invention, is divided into a first surface region 31 for receiving electronic components 32, 33, 34 of the control unit 3 and into a second surface region 35 for receiving the braking resistor 21 of the braking circuit 20. As shown in FIG. 2 in particular, the braking resistor 21 is in the form of a conductor track 36 which is formed on the circuit board 30. This conductor track 36 is—similarly to further conductor tracks on the circuit board 30—created by manufacturing methods which are known per se, for example etching.

The receiving surface 26 of the circuit board 30—the entire surface of a circuit board side 14 or 15 in the embodiment—is made up of the first surface region 31 and the second surface region 35. Provision is made for the second surface region 35 to be situated outside the first surface region 31. In this case, the surface regions 31, 35 can be arranged at a distance u from one another. The distance u selected is dependent on the operating voltage which occurs and/or on the maximum temperature of the braking resistor 21 which occurs in the event of braking. The distance u is selected in such a way that neither electrical flashover from the first surface region 31 to the second surface region 35 nor an impermissible temperature for electronic components 32, 33, 34 in the first surface region 31 can occur.

As shown in FIGS. 1 and 2, the second surface region 35 for receiving the braking resistor 21 extends along at least a first edge 37 of the circuit board 30. In the embodiment, the circuit board 30 is in the form of a rectangle in a plan view of a flat side 14 or 15 according to FIG. 2. A first edge 37 forms a longitudinal edge of the circuit board 30, and another, second edge 38 forms a transverse edge of the circuit board 30. The first edge 37 and the second edge 38 each advantageously form an outer edge of the circuit board 30. An outer edge physically delimits the extent of the circuit board 30.

In the embodiment according to FIG. 2, the braking resistor 21 extends over the first edge 37 and the second edge 38 of the circuit board 30. As shown in the plan view according to FIG. 2, the braking resistor 21 includes a first resistor section 21a which extends along the relatively long, first edge 37 of the circuit board 30. A second resistor section 21b extends along the relatively short second edge 38 of the circuit board 30. As shown in FIGS. 1 and 2, the circuit board 30, in plan view, consists of an approximately rectangular panel with the relatively long first edge 37 and the relatively short second edge 38. A different geometric shape of the circuit board 30 may be expedient, for example a square shape.

The second surface region 35 of the braking resistor 21, which second surface region is in the shape of a border strip, has borders 28, 29 which are advantageously at a distance z from one another and extend, in particular, along the first, relatively long edge 37 of the circuit board 30. The borders 28, 29 delimit—at least in the region of the resistor section 21a—the second surface region 35.

As shown in FIG. 2, the conductor track 36 of the braking resistor 21 runs to and fro between the borders 28 and 29 which are situated at a distance z opposite one another. In this case, the conductor track 36 can be configured as a multiply wound curved path 39. The curved path of the braking resistor 21 is preferably configured as a meander.

Figure 3:
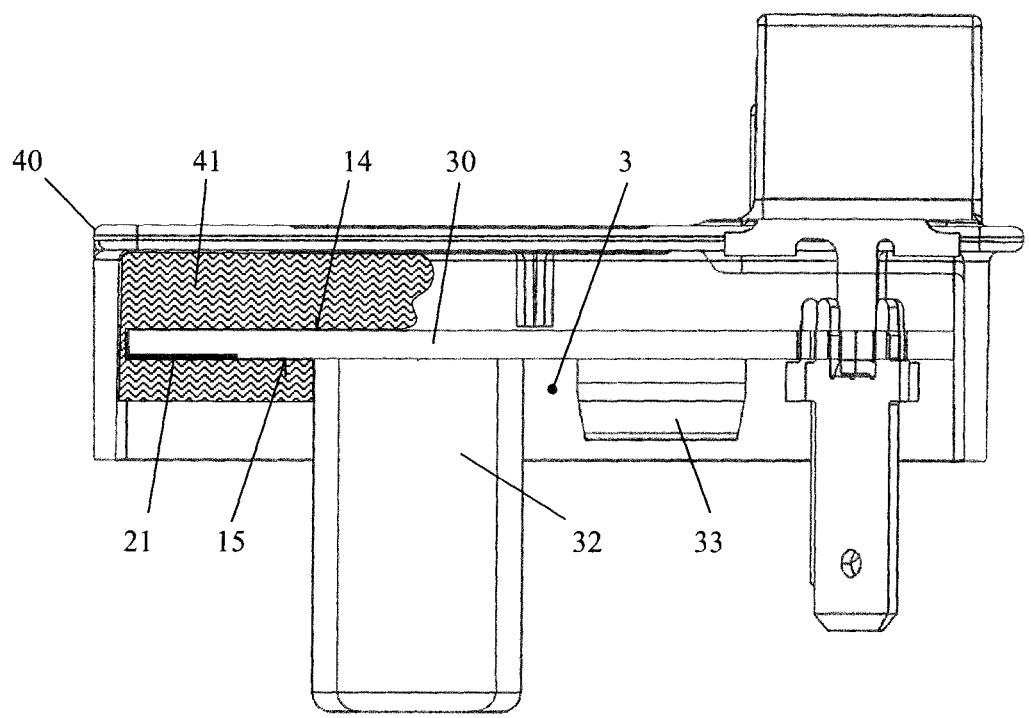

The circuit board 30 can be a plated-through circuit board, so that electronic components 32, 33, 34 can be arranged both on one flat side of the circuit board 30 and on the other flat side of the circuit board 30. The conductor track 36 of the braking resistor 21 is expediently formed on only one flat side 14 of the circuit board 30; it may be expedient to arrange a first braking resistor 21 on one flat side 14 of the circuit board 30 and to arrange a second braking resistor 21' on the other flat side 15 of the circuit board 30, as is schematically indicated in FIG. 3.

The circuit board 30 of the electronic control unit 3 is expediently held in a trough-like receiving housing 40, wherein the circuit board 30 of the control unit is potted with a potting compound 41. The potting compound 41 is made of an electrically insulating, thermally conductive material, for example of polyurethane (PU). Owing to the potting, the conductor track 36 of the braking resistor 21 is in direct thermally conductive contact with the potting compound 41.

The material of the circuit board 30 is, for example, a composite material made of epoxy resin and glass fiber fabric.

Owing to the spatial arrangement of the braking resistor 21 on the circuit board 30, it is possible to form the connection of the braking resistor 21 to the motor M on the circuit board 30. As a result, the wiring branch denoted 20a in FIG. 1 can be dispensed with; only the wiring branch 20b for electrical connection of the braking switch 22 is required separately from the circuit board 30. The braking switch 22 is situated outside the control unit 3. The braking switch 22 is situated spatially next to the control unit 3, as shown in the plan view according to FIG. 2.

In the case of a braking switch 22 which is arranged on the circuit board 30, as is illustrated in FIG. 2, the electrical wiring complexity for the braking circuit 20 is dispensed with. The braking resistor 21 and also the electrical connections of the braking circuit 20 and to the braking switch 22 can be formed on the circuit board 30, preferably as conductor tracks.

It is understood that the foregoing description is that of the preferred embodiments of the invention and that various changes and modifications may be made thereto without departing from the spirit and scope of the invention as defined in the appended claims.

What is claimed is:

1. An electronic control unit for operating an electric motor with a battery pack, the electronic control unit comprising:
   electronic components for controlling the electric motor;
   an electric braking circuit having a braking resistor defining an electric load to reduce a regenerative voltage of the electric motor via said braking resistor while the electric motor runs out;
   a braking switch configured to switch in said electric braking circuit;
   a circuit board having a receiving surface for said electric components and said braking resistor;
   said receiving surface being spatially divided into a first surface region configured to receive said electronic components and a second surface region configured to receive said braking resistor;
   said braking resistor being configured as a conductor track formed on said circuit board; and,
   said conductor track being formed directly on said circuit board in said second surface region so as to have a flat configuration and be in contiguous surface-to-surface contact with said circuit board over the entire extent of said conductor track thereby facilitating a dissipation of heat generated during a running-down of said electric motor.

2. The electronic control unit of claim 1, wherein:
   said circuit board has a first edge; and,
   said second surface region extends outside of said first surface region along said first edge of said circuit board.

3. The electronic control unit of claim 2, wherein:
   said circuit board further has a second edge; and,
   said conductor track extends along said first and said second edges.

4. The electronic control unit of claim 1, wherein:
   said second surface region has a first border and a second border;
   said first border is disposed opposite to said second border at a spacing (z) therefrom; and,
   said conductor track is guided from side-to-side between said first border and said second border along said second surface region.

5. The electronic control unit of claim 1, wherein said conductor track is formed as a multiply wound curved path.

6. The electronic control unit of claim 5, wherein said conductor track is formed as a meander.

7. The electronic control unit of claim 1, wherein:
   said circuit board has a flat side; and,
   said conductor track is formed only on said flat side of said circuit board.

8. The electronic control unit of claim 1, wherein:
   said circuit board is potted with a potting compound; and,
   said conductor track is in direct thermally conductive contact with said potting compound.

9. The electronic control unit of claim 1, wherein said braking switch is arranged on said circuit board.

10. The electronic control unit of claim 1, wherein said circuit board is made of an epoxy resin and a glass fiber fabric.

11. The electronic control unit of claim 1 further comprising a potting compound made of polyurethane.

12. The electronic control unit of claim 2, wherein said braking resistor extends along said first edge of said circuit board.

13. The electronic control unit of claim 12, wherein said circuit board has a second edge extending to said first edge; and, said second surface region extends along said second edge outside of said first surface region.

14. The electronic control unit of claim 13, wherein said braking resistor extends along said second edge of said circuit board.

15. The electronic control unit of claim 13, wherein said braking resistor has a first resistor section and a second resistor section; and, said first resistor section lies along said first edge of said circuit board and said second resistor section lies along said second edge of said circuit board.

16. The electronic control unit of claim 13, wherein said first edge and said second edge are arranged so as to be mutually perpendicular.

17. The electronic control unit of claim 13, wherein said first edge defines a longitudinal edge of said circuit board and said second edge defines an end edge of said circuit board.

18. The electronic control unit of claim 13, wherein said first edge and said second edge define respective outer edges of said circuit board.

19. An electronic control unit for operating an electric motor with a battery pack, the electronic control unit comprising:
   electronic components for controlling the electric motor;
   an electric braking circuit having a braking resistor defining an electric load to reduce a regenerative voltage of the electric motor via said braking resistor while the electric motor runs out;
   a braking switch configured to switch in said electric braking circuit;
   a circuit board having a receiving surface for said electric components and said braking resistor;
   said receiving surface being spatially divided into a first surface region configured to receive said electronic components and a second surface region configured to receive said braking resistor;
   said braking resistor being configured as a conductor track formed on said circuit board;
   said circuit board having first and second edges with said second edge extending to said first edge whereat said edges conjointly define a corner of said circuit board;
   said second surface region lying outside of said first surface region and along said second edge; and,
   said conductor track running along said first edge to said corner whereat said conductor track changes direction to run along said second edge of said circuit board.

* * * * *

UNITED STATES PATENT AND TRADEMARK OFFICE
CERTIFICATE OF CORRECTION

PATENT NO. : 11,038,402 B2
APPLICATION NO. : 15/459919
DATED : June 15, 2021
INVENTOR(S) : K. Gurr et al.

Page 1 of 1

It is certified that error appears in the above-identified patent and that said Letters Patent is hereby corrected as shown below:

In the Specification

In Column 2:
Line 55: insert -- III-III -- after "line".

Signed and Sealed this
Twenty-seventh Day of July, 2021

Drew Hirshfeld
*Performing the Functions and Duties of the*
*Under Secretary of Commerce for Intellectual Property and*
*Director of the United States Patent and Trademark Office*